United States Patent
Lim et al.

(10) Patent No.: US 11,186,776 B2
(45) Date of Patent: Nov. 30, 2021

(54) COMPOSITES WITH ENHANCED THERMAL CONDUCTIVITY AND METHOD PREPARING THE SAME

(71) Applicant: KOREA INSTITUTE OF SCIENCE AND TECHNOLOGY, Seoul (KR)

(72) Inventors: Hong Jin Lim, Jeollabuk-do (KR); Nam Ho You, Jeollabuk-do (KR); Seokhoon Ahn, Jeollabuk-do (KR); Munju Goh, Jeollabuk-do (KR); Se Gyu Jang, Jeollabuk-do (KR); Myung Jong Kim, Jeollabuk-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 167 days.

(21) Appl. No.: 16/538,831

(22) Filed: Aug. 13, 2019

(65) Prior Publication Data
US 2020/0056094 A1    Feb. 20, 2020

(30) Foreign Application Priority Data
Aug. 17, 2018    (KR) .................. 10-2018-0096187

(51) Int. Cl.
| C09K 19/38 | (2006.01) |
| C08K 3/013 | (2018.01) |
| C08K 3/14 | (2006.01) |
| C08K 3/22 | (2006.01) |
(Continued)

(52) U.S. Cl.
CPC ............ *C09K 19/388* (2013.01); *C08K 3/013* (2018.01); *C08K 3/14* (2013.01); *C08K 3/22* (2013.01); *C08K 3/28* (2013.01); *C08L 63/00* (2013.01); *C08K 2201/001* (2013.01)

(58) Field of Classification Search
CPC . C08K 3/22; C08K 3/28; C09K 19/38; C09K 19/388; C08G 59/24; C08G 59/245; C08G 59/40; C08G 59/68
See application file for complete search history.

(56) References Cited

U.S. PATENT DOCUMENTS
| 5,962,547 A | 10/1999 | Nikolic et al. |
| 6,261,481 B1 | 7/2001 | Akatsuka et al. |
| 6,376,638 B1 | 4/2002 | Lee et al. |
(Continued)

FOREIGN PATENT DOCUMENTS
| EP | 1481999 A2 | 12/2004 |
| EP | 1832636 A1 | 9/2007 |
(Continued)

OTHER PUBLICATIONS

Jang (Preparation of Cationic Latent Initiators Containing Imidazole Group and Their Effects on the Properties of DGEBA Epoxy Resin. Macromolecular Research, 2011, 19(10), pp. 989-997).*
(Continued)

*Primary Examiner* — Brieann R Johnston
(74) *Attorney, Agent, or Firm* — Cantor Colburn LLP

(57) ABSTRACT

The present disclosure relates to a high thermal conductive polymer composite, comprising: a liquid crystalline resin comprising a mesogen and at least one linear polymerization reactive group, wherein the liquid crystalline resin is cured with a linear polymerization initiator and includes a molecular structure aligned in at least one direction.

11 Claims, 9 Drawing Sheets

(51) Int. Cl.
*C08K 3/28* (2006.01)
*C08L 63/00* (2006.01)

(56) References Cited

U.S. PATENT DOCUMENTS

| | | |
|---|---|---|
| 6,977,274 B2 | 12/2005 | Lee et al. |
| 7,714,037 B1 | 5/2010 | Klemarczyk |
| 7,795,744 B2 | 9/2010 | Chen et al. |
| 8,216,672 B2 | 7/2012 | Smith et al. |
| 8,419,972 B2 | 4/2013 | Hirai et al. |
| 2004/0102597 A1 | 5/2004 | Tobita et al. |
| 2011/0262728 A1* | 10/2011 | Izutani .................. C08L 63/00 428/220 |
| 2013/0200298 A1 | 8/2013 | Izutani et al. |

FOREIGN PATENT DOCUMENTS

| | | |
|---|---|---|
| JP | 2005139298 A | 6/2005 |
| JP | 5731199 B2 | 6/2015 |
| JP | 6222209 B2 | 11/2017 |
| JP | 6311263 B2 | 4/2018 |
| KR | 101503284 B1 | 3/2015 |
| KR | 1020180055776 A | 5/2018 |

OTHER PUBLICATIONS

Google patents translation of JP 2005139298 (2005, 9 pages).*
Malik (Review on UV-Induced Cationic Frontal Polymerization of Epoxy Monomers, Polymers, 12(9), 2146, 2020, 34 pages).*
Huang (Spherical and flake-like BN filled epoxy composites: morphological effect on the thermal conductivity, thermos-mechanical and dielectric properties, J Mater Sci: Mater Electron, 26, 2015, pp. 3564-3572).*
Youngsu Kim et al., "Development of Highly Thermal Conductive Liquid Crystalline Epoxy Resins for High Thermal Dissipation Composites," Composites Research, 2017, pp. 1-6, vol. 30, No. 1, English abstract.
Hongyu Chen et al., "Thermal conductivity of polymer-based composites: Fundamentals and applications," Progress in Polymer Science, 2016, pp. 41-85, vol. 59, Elsevier Ltd.
Isaac Isarn et al., "New BN-epoxy composites obtained by thermal latent cationic curing with enhanced thermal conductivity," Composites: Part A, 2017, pp. 35-47, vol. 103, Elsevier Ltd.
European Search Report for EP Application No. 19191687.3 dated Jan. 15, 2020.
Korean Office Action for KR Application No. 10-2018-0096187 dated Feb. 6, 2020.
Chien et al., "Side-Chain Liquid-Crystal Epoxy Polymer Binders for Polymer-Dispersed Liquid Crystals," Macromolecules, 1992, pp. 133-137, vol. 25, No. 1.
G.G. Barclay et al., "Liquid Crystalline Epoxy Thermosets Based on Dihydroxymethylstilbene: Synthesis and Characterization," Journal of Polymer Science, 1992, pp. 1831-1843, vol. 30.
Joseph J. Mallon et al., "Synthesis and Characterization of Novel Epoxy Monomers and Liquid Crystal Thermosets," Journal of Polymer Science, 1993, pp. 2249-2260, vol. 31.
S. Jahromi et al., "Liquid Crystalline Epoxide Thermosets. Dynamic Mechanical and Thermal Properties," Macromolecules, 1995, pp. 2201-2211, vol. 28, No. 7.

* cited by examiner

COMPOSITES WITH ENHANCED THERMAL CONDUCTIVITY AND METHOD PREPARING THE SAME

This study was supported by following national research project:

Ministry of Trade, Industry and Energy, Republic of Korea (Development of 20 W/mk class lightweight, high heat dissipation circuit board manufacturing technology based on biomimetics, Project No. 1415157228) under the superintendence of Korea Institute of Science and Technology.

CROSS-REFERENCE TO RELATED APPLICATION

This application claims the priority of Korean Patent Application No. 10-2018-0096187, filed on Aug. 17, 2018, and all the benefits accruing therefrom under 35 U.S.C. § 119, the contents of which in its entirety are herein incorporated by reference.

BACKGROUND OF THE INVENTION

Field of the Invention

Disclosed herein are high thermal conductive polymer composite compositions that provide enhanced thermal conductivity to polymer composites and methods of preparing the same.

Description of the Related Art

Recently, the demand for functional improvement of electronic devices and the miniaturization have required the device to consume more electric energy in a smaller volume. Accordingly, accumulation of heat causes computational errors or malfunction due to high temperature, and the like. Therefore, there is a growing interest in materials for managing the thermal of electronic products. Polymer composites including high thermal conductive fillers have been recognized as the most reasonable thermal management solution considering moldability and economic efficiency.

In the polymer composite, the polymer is used as a matrix wrapping the periphery of a filler and greatly affects the mechanical properties and characteristics of the composite. Particularly, in terms of thermal conductivity, the polymer composite wraps a filler material that has higher thermal conductivity than a polymer, so even though the thermal conductivity inside the filler is high, phonons are scattered when heat is transferred through the polymer layer, and the thermal conductivity of the composite is greatly reduced. Most of the polymers have low thermal conductivity of 0.1-0.2 W/mK, so it is very important to increase the thermal conductivity of the polymer resin in the polymer composite. There have been various efforts to solve this issue.

Liquid crystal molecules are materials that have fluidity like liquids, though they have an aligned structure like solids at the molecular level. It is possible to prepare a polymer resin having enhanced thermal conductivity by minimizing phonon scattering when a resin is prepared by using the aligned structure of such liquid crystal at molecular level. When such a resin is used as a matrix of the composite, a further enhanced thermal conductivity of the composite can be obtained with the contents of a filer. Liquid crystal molecules have a mesogen core and can form molecular structures aligned by the core. Studies have been conducted for a variety of liquid crystalline epoxy resins introduced with epoxy functional groups having a very high applicability as a curable resin to a material having a mesogen core as described (see Non-Patent Documents 1 to 4).

In Patent Documents 1 to 3, the liquid crystalline epoxy resin has a microscopic alignment structure due to law of a natural entropy increase when external energy, such as an electromagnetic field, is not applied, but macroscopically, the alignment structure has a polycrystal structure oriented in different directions from one another. The existing technology for improving the thermal conductivity using the liquid crystalline epoxy focuses on the diversification of mesogen cores. High thermal conductivity of up to 0.89 W/mK has been achieved through technology that increases the thermal conductivity by arranging the aligned molecular structure in one macroscopic direction via application of an electric field or a magnetic field.

In addition, in Patent Documents 4 to 11, the linear polymerization initiator is a material that can generate radicals, cations, anions, and the like, so that functional groups such as vinyl, epoxy, acetylene, and the like can be linearly polymerized and synthesized into structures like noodle stripes. It is often used in polymer polymerization and various initiators are known. Polymer monomers such as vinyl, styrene, acrylate and methacrylate can be linearly polymerized by radicals, cations, anions, and the like. In the case of epoxy functional groups, polymerization is carried out by cations and anions.

However, the application of an electric field and a magnetic field is not commercialized due to the disadvantage that it is difficult to apply a mass production process because of expensive large-scale equipment and difficulties in continuous processing. Accordingly, it is necessary to develop a technology that can improve the degree of alignment of the liquid crystalline epoxy and achieve enhanced thermal conductivity without introducing additional processes such as the application of an electromagnetic field. In addition, since the polymerization reaction is linear, it gets longer as the reaction proceeds. This deals with a case where only one functional group is present in a monomer.

CITATION LIST

Patent Literature (Patent Document 1) EP 1,481,999
(Patent Document 2) U.S. Pat. No. 6,261,481
(Patent Document 3) US 2004-0102597
(Patent Document 4) EP 1,832,636 A1
(Patent Document 5) U.S. Pat. No. 5,962,547
(Patent Document 6) U.S. Pat. No. 6,977,274 B2
(Patent Document 7) U.S. Pat. No. 7,714,037 B1
(Patent Document 8) U.S. Pat. No. 7,795,744 B2
(Patent Document 9) U.S. Pat. No. 8,216,672 B2
(Patent Document 10) U.S. Pat. No. 8,419,972 B2
(Patent Document 11) US 2013-0200298 A1

Non-Patent Literature (Non-Patent Document 1) Barclay, et al. Journal of Polymer Science, Part A: Polymer Chemistry, 30, p 1831-1843, 1992
(Non-Patent Document 2) Chien, et al. Macromolecules, 25, p 133-137, 1992
(Non-Patent Document 3) Mallon, et al. Journal of Polymer Science, Part A: Polymer Chemistry, 31, p 2249-2260, 1993

(Non-Patent Document 4) Jahromi, et al. Macromolecules, 28, p 2201-2211, 1995

SUMMARY OF THE INVENTION

It is an object of embodiments of the present disclosure to provide an enhanced thermal conductivity of a polymer composite.

It is another object of embodiments of the present disclosure to provide a composite composition and a curing method in which the alignment structure of a liquid crystalline resin that forms a microscopically aligned structure at the molecular level is cured in an aligned form, as it is, through linear polymerization.

It is another object of embodiments of the present disclosure to provide a composite composition and a curing method that has enhanced thermal conductivity through the efficiency of phonon transfer of cured resins and composites that have an aligned structure.

In one embodiment of the present disclosure, there is provided a high thermal conductive polymer composite, including: a liquid crystalline resin including a mesogen and at least one linear polymerization reactive group, wherein the liquid crystalline resin is cured with a linear polymerization initiator and includes a molecular structure aligned in at least one direction.

In one embodiment, the mesogen may include at least one selected from the group consisting of a biphenyl group, a cyanobiphenyl group, a terphenyl group, a cya terphenyl group, a phenylbenzoate group, an azobenzene group, an azomethine group, an azomethylbenzene group, a stilbene group, a phenylcyclohexyl group, a phenylcyclohexyl group, a phenyl ester group, a phenoxyphenyl group, a benzylidene aniline group, a benzyl benzoate group, a phenylpyrimidine group, a phenyl dioxane group, a benzoyl aniline group, a diacetylene group, and derivatives thereof.

In one embodiment, the linear polymerization reactive group may include one or more reactors selected from the group consisting of epoxy, acetylene, vinyl, acrylate, methacrylate, styrene, norbornene, and derivatives thereof.

In one embodiment, the polymer composite may further include at least one filler, and the liquid crystalline resin may be impregnated with the filler.

In one embodiment, the filler may include at least one selected from the group consisting of oxides, nitrides, and carbides.

In one embodiment, the filler may be contained in an amount of 30% by volume or more based on the total volume of the polymer composite.

In another embodiment of the present disclosure, there is provided a method of preparing a high thermal conductive polymer composite, comprising: mixing a liquid crystalline resin and a linear polymerization initiator to prepare a mixture; and curing the mixture, wherein the liquid crystalline resin includes a mesogen and at least one linear polymerization reactive group.

In one embodiment, the preparation of the mixture may include the liquid crystalline resin being aligned in at least one direction to form a liquid crystal phase.

In one embodiment, the molecular alignment structure of the liquid crystal phase may be maintained in the curing of the mixture.

In one embodiment, the preparation of the mixture may further mix a filler, and the liquid crystalline resin may be impregnated with the filler.

In one embodiment, the filler may be contained in an amount of 30 to 60% by volume based on the total volume of the mixture.

In one embodiment, during the curing, the reactive group of the liquid crystalline resin is linearly polymerized and cured, maintaining the molecular alignment structure of the liquid crystal phase.

In one embodiment, the linear polymerization initiator may generate at least one of a radical, an anion, or a cation.

In one embodiment, the linear polymerization initiator may be contained in an amount of 0.5 to 5.0% by weight based on the total weight of the mixture.

In one embodiment, the curing may be by thermocompression, and may be performed at a pressure of 5 MPa or higher and a temperature in the range of 150 to 250° C.

DETAILED DESCRIPTION OF THE PREFERRED EMBODIMENTS

Definition of Terms

Figure 1A:
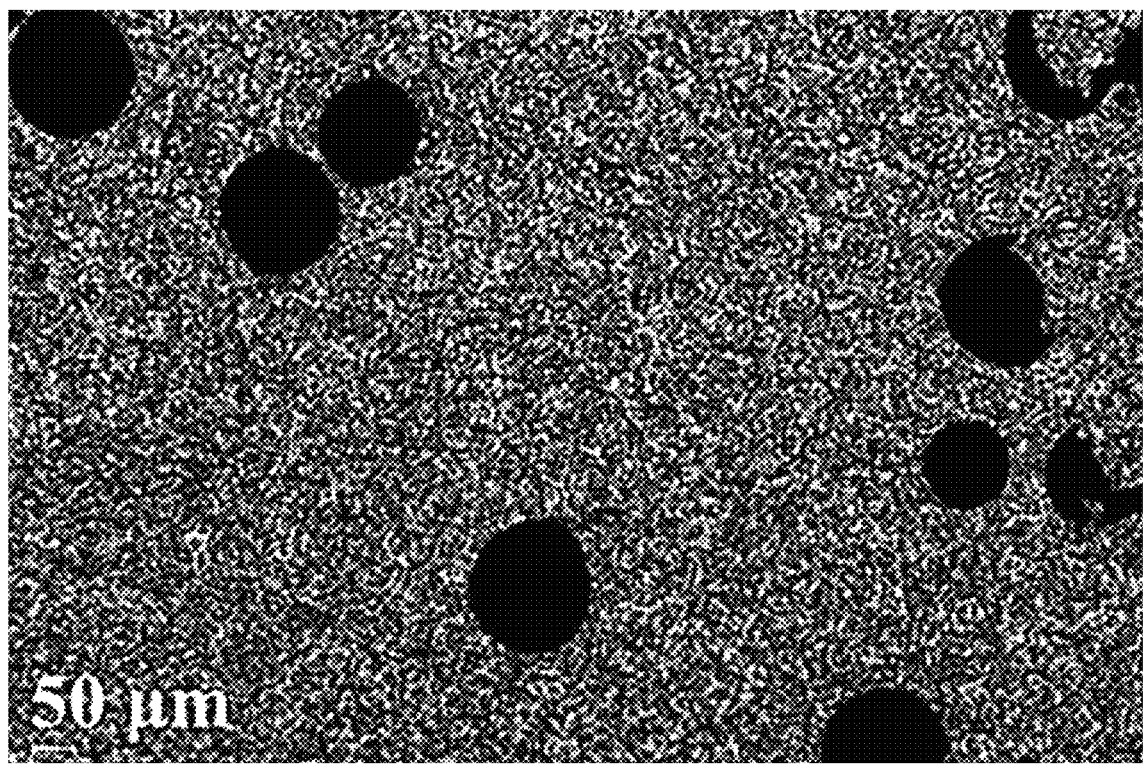
FIG. 1A is a polarizing micrograph of a liquid crystalline epoxy resin according to an embodiment of the present disclosure, which has a microscopically aligned structure and has macroscopically multiple lattice.

As used herein, the term "alignment" means orienting the liquid crystalline resin so as to have a regular arrangement.

As used herein, the term "aligned multi-lattice structure at the molecular level" means a polycrystalline liquid crystal structure in which molecules constituting a material are aligned microscopically in one direction, but each lattice is aligned in different directions macroscopically and has a two-dimensional and three-dimensional structure, and is distinguished from molecules of materials that are aligned in one direction by energy such as an external magnetic field and an electric field.

As used herein, the term "microscopic" means an observation range of several nanometers to tens of micrometers, meaning that it cannot be visually confirmed and can be confirmed by using a microscope, an electron microscope, or the like.

As used herein, the term "macroscopic" means an observation range of several tens of micrometers or more and is often visually confirmed.

As used herein, the term "multi-lattice" means a structure aligned in one direction at the microscopic observation level but a structure in which aligned structures are irregularly arranged in different directions at a macroscopic observation level.

As used herein, the term "resin" refers to a material that is curable by chemical cross-linking with a material that constitutes the continuous phase of the composite. The resin may be a monomer or an oligomer, a polymer, or a combination thereof.

As used herein, the term "linear polymerization" is a form of polymeric polymerization in which reactive functional groups of monomers, oligomers, polymers, or mixtures thereof are linked one-dimensionally by chemical reactions and are distinguished from dendritic or epoxy amine reactions of branch stretch type.

Hereinafter, exemplary embodiments of the present disclosure will be described in detail.

High Thermal Conductive Polymer Composite

Exemplary embodiments of the present disclosure provide a high thermal conductive polymer composite, comprising: a liquid crystalline resin including a mesogen and at least one linear polymerization reactive group, wherein the liquid crystalline resin is cured with a linear polymerization initiator and includes a molecular structure aligned in at least one direction.

In one embodiment, the high thermal conductive polymer composite may provide an enhanced thermal conductivity of at least by about 30% as compared to a resin that does not have an aligned multi-lattice structure at the molecular level.

In one embodiment, the mesogen may include at least one selected from the group consisting of a biphenyl group, a cyanobiphenyl group, a terphenyl group, a cyano terphenyl group, a phenylbenzoate group, an azobenzene group, an azomethine group, an azomethylbenzene group, a stilbene group, a phenylcyclohexyl group, a phenylcyclohexyl group, a phenyl ester group, a phenoxyphenyl group, a benzylidene aniline group, a benzyl benzoate group, a phenylpyrimidine group, a phenyl dioxane group, a benzoyl aniline group, a diacetylene group, and derivatives thereof.

In one embodiment, the liquid crystalline resin may include molecular structures aligned in at least one direction and may also have multiple lattices arranged in one direction microscopically and in different directions macroscopically. For example, the liquid crystalline resin may be a 4,4'-diglycidyloxybiphenyl monomer and an oligomer. For example, 4,4'-diglycidyloxybiphenyl is a solid at room temperature and is melted at 150° C.-175° C. to form aligned molecular structure (liquid crystalline).

Since the liquid crystalline resin is microscopically aligned in one direction, a regular molecular structure may be formed and phonon scattering may be minimized, so that the liquid crystalline resin may have a higher thermal conductivity than a general resin.

Generally, in order to minimize the loss of a regular structure in the curing process, the regular structure may be maintained through a curing method including applying a large energy electric field or a magnetic field, but this method may require expensive large equipment and additional processing, and thus is disadvantageous for mass production.

In one embodiment, the linear polymerization reactor of the liquid crystalline resin may be a functional group capable of being polymerized in the monomer by at least one of radicals, anions, and cations. Preferably, the linear polymerization reactor may be a functional group polymerizable by a cation.

In one embodiment, the linear polymerization reactor may include one or more reactive groups selected from the group consisting of epoxy, acetylene, vinyl, acrylate, methacrylate, styrene, norbornene, and derivatives thereof.

In one embodiment, the linear polymerization reactive group of the liquid crystalline resin may be two or more. When the liquid crystalline resin having two or more linear polymerization reactive groups is linearly polymerized, the linear polymers cross-link one another and the resin is cured. Accordingly, a linear polymerization reactive group, such as a monomer having two or more epoxy functional groups, may form a crosslinked structure when it is polymerized by linear polymerization. In addition, in the case of a structure well aligned by liquid crystal formation, linear polymerization reactive groups are also aligned. Thus, when they are linearly polymerized, cross-linked curing can be achieved without breaking microscopic alignment structure, so it may be possible to prepare a curable resin having excellent molecular alignment even after curing compared to a non-linear curing agent such as an amine curing agent. Accordingly, when a linear polymerization initiator capable of curing while maintaining an aligned structure is used instead of an amine curing agent which is cured while breaking the existing aligned structure, it may be possible to minimize the scattering of phonons without expensive additional equipment and processes such as introduction of electromagnetic fields, thereby dramatically improving the thermal conductivity of the resin.

In one embodiment, the high thermal conductive polymer composite may be formed by linear polymerization of a liquid crystalline resin.

When a high thermal conductive polymer composite is formed by linear polymerization, the liquid crystalline resin is aligned in at least one direction to form a regular molecular structure and minimize phonon scattering, so that it can have a higher thermal conductivity than a general resin. On the other hand, when a high thermal conductive polymer composite is formed by non-linear polymerization, for example, when a diamine curing agent is used, the curing agent has a bonding angle of about 120 degrees, which may break the regular molecular structure of the liquid crystalline epoxy. The high thermal conductive polymer composite formed through the linear polymerization may have a thermal conductivity improved by about 30% or more as compared with that formed through non-linear polymerization.

In one embodiment, the polymer composite further includes at least one filler, wherein the liquid crystalline resin may be impregnated with the filler.

In one embodiment, the liquid crystalline resin may be impregnated in a filler. For example, the hexagonal boron nitride particles in a plate shape may be aligned in an irregular direction, and a liquid crystal resin may be impregnated between the fillers to have a low porosity. Specifically, the high thermal conductive polymer composite according to the present disclosure may have a porosity of 5% or less, 4% or less, 3% or less, 2% or less, 1% or less, 0.8% or less, or 0.5% or less. If the porosity of the high thermal conductive polymer composite is more than 5%, the pores between the filler and the liquid crystalline resin may be filled with air having low thermal conductivity, and the thermal conductivity may be adversely affected.

In one embodiment, the filler may include at least one selected from the group consisting of oxides, nitrides, and carbides. Preferably, the filler may be a hexagonal boron nitride in a plate shape. Particularly, the hexagonal boron nitride particles in a plate shape are ordered in an irregular direction and the resin may be impregnated well between the particles.

In one embodiment, the filler may include at least 30% by volume or more based on the total volume of the polymer composite. Specifically, it may be contained in an amount of 30% or more by volume, 40% or more by volume, or 50% or more by volume, and may be contained in the range of 30% by volume to 60% by volume. When the filler is contained in the above range, the prepared polymer composite may exhibit high thermal conductivity.

Method of Preparing a High Thermal Conductive Polymer Composite

In another embodiment of the present disclosure, there is provided a method of preparing a high thermal conductive polymer composite, comprising: mixing a liquid crystalline resin and a linear polymerization initiator to prepare a mixture; and curing the mixture, wherein the liquid crystalline resin includes a mesogen and at least one linear polymerization reactive group.

In one embodiment, the preparation of the mixture may include the liquid crystalline resin being aligned in at least one direction to form a liquid crystal phase.

In one embodiment, the molecular alignment structure of the liquid crystal phase may be maintained in the curing of the mixture.

In one embodiment, the preparation of the mixture may further mix a filler, and the liquid crystalline resin may be impregnated with the filler.

In one embodiment, the filler may include from 30 to 60% by volume, based on the total volume of the mixture. Specifically, it may be included in an amount of 40 to 50% by volume, 40 to 60% by volume, 50 to 60% by volume, 30 to 50% by volume, or 30 to 40% by volume. When the filler is contained in the above range, the prepared polymer composite may exhibit high thermal conductivity.

In one embodiment, in the curing, the molecular alignment structure of the liquid crystal phase may be maintained, and the reactive group of the liquid crystalline resin may be linearly polymerized and cured.

In one embodiment, a linear polymerization initiator may be used to linearly polymerize the functional groups of the liquid crystalline resin. When a linear polymerization initiator is used, the thermal conductivity may be improved by about 10% or more, about 20% or more, about 30% or more, or about 40% or more as compared with the non-linear polymerization initiator. This is because, in the nonlinear polymerization such as epoxy-amine, the regular structure formed by the liquid crystal is widened by the bonding structure, whereas in the case of the linear polymerization, the regular structure is maintained as it is while the curing is performed (see FIG. 2).

For example, in the case of amines (or diamines) which are generally used as curing agents for epoxy resins, they have a three-dimensional curing structure. For example, when a bond is formed by the reaction of an amine with an epoxy, a distorted structure of about 120 degrees is formed. As a result, the microstructure aligned by the formation of the liquid crystal structure is three-dimensionally twisted by the amine curing agent and may be converted into an irregular structure, resulting in a decrease in thermal conductivity. The breakdown of the regular alignment structure and the reduction of the thermal conductivity according to the above-mentioned curing can be solved by curing the aligned liquid crystal molecules as it is in the state aligned without an angle.

In one embodiment, the linear polymerization initiator may be one that generates at least one of a radical, an anion, or a cation.

In an exemplary embodiment, the linear polymerization initiator capable of curing while maintaining the aligned multi-lattice structure at the molecular level of the high thermal conductive resin may be an initiator that may generate at least one or more of radicals, anions, and cations to polymerize functional groups of the resin linearly, and may preferably be a benzyl imidazolium hexafluoroantimonate (BIHA), which forms a cation.

For example, the linear polymerization initiator may be cured at a temperature of 250° C. while maintaining a multi-lattice structure. This is known to be because it is rapidly cured while maintaining the aligned structure at the molecular level by the linear curing agent.

In one embodiment, the linear polymerization initiator may be contained in an amount of 0.5 to 5.0% by weight based on the total weight of the mixture.

If the linear polymerization initiator is contained in an amount of less than 0.5% by weight based on the total weight of the mixture, curing is not sufficiently carried out and may be easily broken. When the linear polymerization initiator is contained in an amount exceeding 5.0% by weight, the multi-lattice structure may not be maintained.

In one embodiment, the curing may be by thermocompression, and may be performed at a pressure of at least 5 MPa and at a temperature in the range of 150 to 250° C. Preferably, it may be prepared by after mechanical grinding and mixing, heating to about 175° C., and applying a pressure of about 10 MPa. If the temperature is less than 150° C. in the curing, the composite may not be sufficiently cured, and if the temperature is higher than 250° C., the liquid crystalline epoxy resin may not form a regularly aligned molecular structure.

In addition, more specifically, the pressure may be at least 5 MPa, at least 10 MPa, at least 15 MPa, or at least 20 MPa. The pressure may range from 5 to 40 MPa, from 5 to 30 MPa, or from 5 to 20 MPa. If the pressure is less than 5 MPa, pores may be generated in the composite, and if the pressure is more than 40 MPa, the cured product may be leached out of the mold.

In one embodiment, the temperature range in which the thermocompression is performed may be a temperature range in which the high thermal conductive resin and the linear polymerization initiator form a multi-lattice structure, and in the case of 4,4'-diglycidyloxybiphenyl resin, it may be preferably in the range of 155–175° C.

Hereinafter, the configuration and effects of the present disclosure will be described in more detail with reference to examples. However, these examples are provided for illustrative purposes only in order to facilitate understanding of the present disclosure, and the category and scope of the present disclosure are not limited by the following examples.

[Preparation Example 1] Synthesis of Liquid Crystalline Resin

A mixture of 4,4'-diglycidyloxybiphenyl monomers containing biphenyl mesogen and epoxy functional groups at both ends and oligomers was synthesized as a liquid crystalline resin for the preparation of a composite. Specifically, 1 L of epichlorohydrin was injected into a three-necked round bottom flask, and then 615 mmol of 4,4'-biphenol and 18 mmol of benzyltrimethyl-ammonium bromide were additionally mixed. After heating for 30 minutes at 110° C. while stirring, 308 mL of 4.0 M sodium hydroxide was slowly injected for 1 hour. After the injection was completed, the mixture was stirred for 1 hour and then cooled to room temperature. The water generated and excess epichlorohydrin were removed by vacuum distillation and the resulting white powder was washed three times with water. The final refined powder (175 g) was dried in a vacuum oven.

[Experimental Example 1] Polarizing Microscopic Analysis of Liquid Crystalline Resin According to Preparation Example 1

Figure 1B:
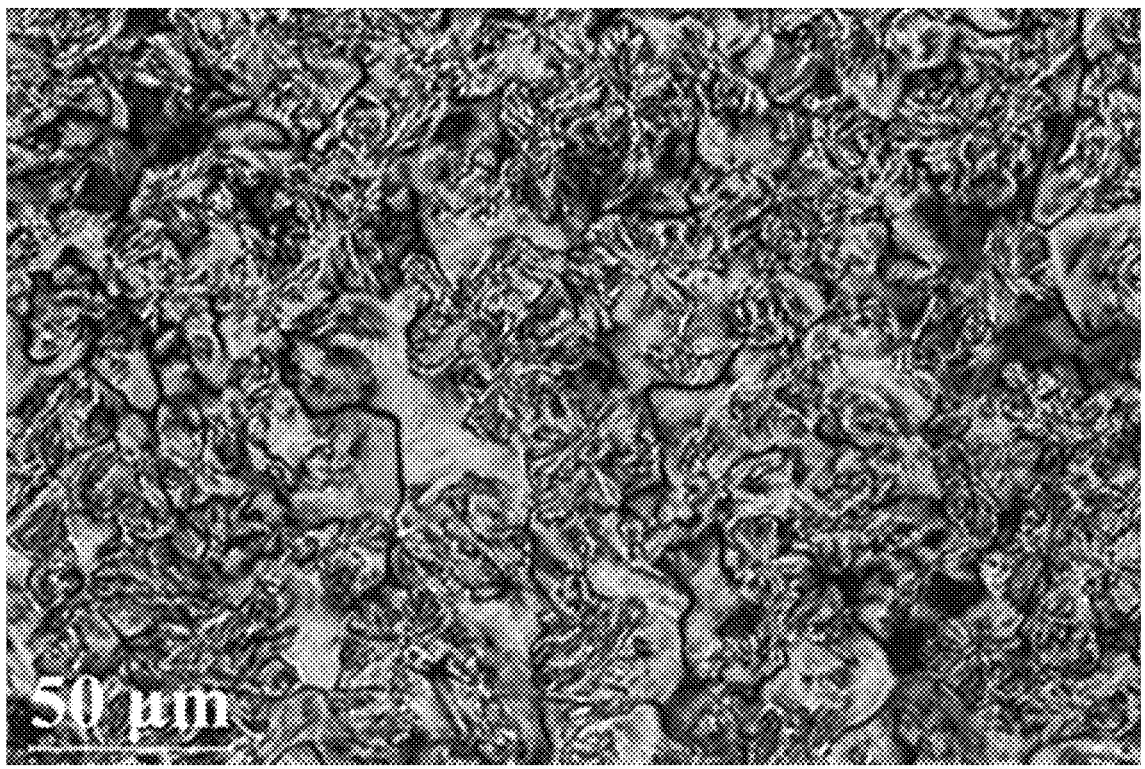
FIG. 1B is an enlarged photograph of the polarizing micrograph of FIG. 1A.

FIGS. 1A and 1B are polarizing micrographs of the liquid crystalline resin synthesized in Preparation Example 1, and show a polarization micrograph of 4,4'-diglycidyloxybiphenyl heated to about 160° C.

Specifically, the polarizing patterns of different colors are observed in FIGS. 1A and 1B, which show that 4,4'-diglycidyloxybiphenyl forms an aligned molecular structure. In addition, the irregularly shaped multi-patterns show that the molecular structure forms a multi-lattice structure with different aligned directions.

[Experimental Example 2] Analysis of the Aligned Molecular Structure According to the Temperature Change of the Liquid Crystalline Resin According to Preparation Example 1

Solid state powder of 4,4'-diglycidyloxybiphenyl liquid crystalline epoxy resin was placed between two glass slides and the temperature was heated at a rate of 50° C. per minute through a heat stage equipped to a polarizing microscope, and a polarizing microscope image was observed.

Figure 3A:
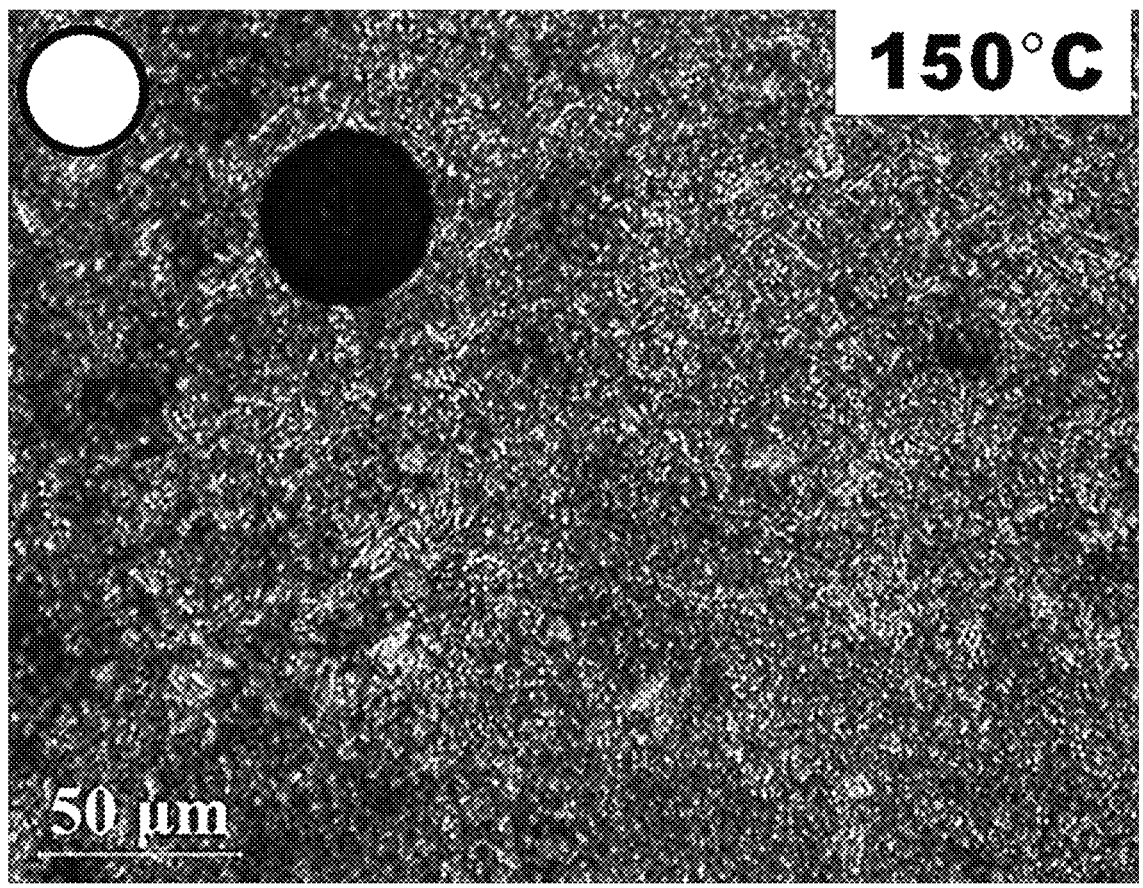
FIG. 3A is a polarizing micrograph of a liquid crystalline epoxy resin according to an embodiment of the present disclosure when heated at 150° C.
Figure 3B:
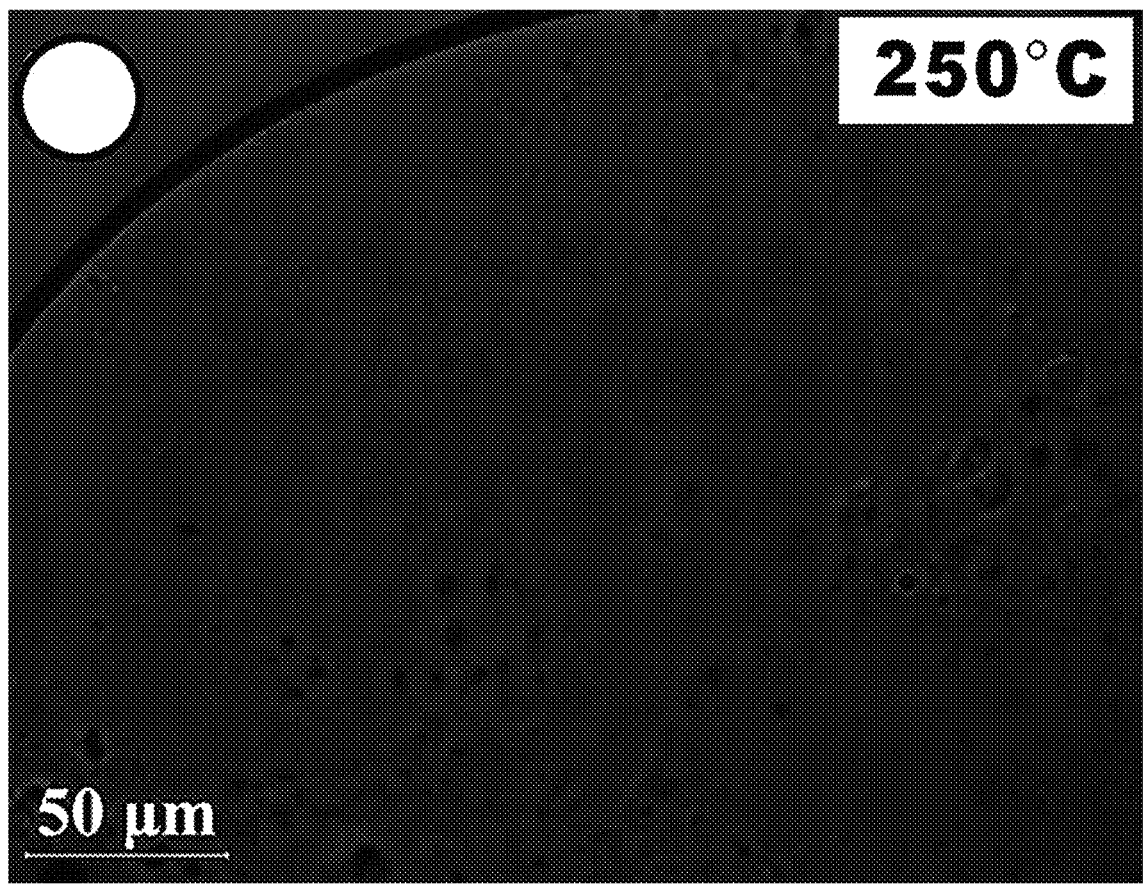
FIG. 3B is a polarizing micrograph of a liquid crystalline epoxy resin according to an embodiment of the present disclosure when heated at 250° C.

FIGS. 3A and 3B show a polarizing micrograph of a 4,4'-diglycidyloxybiphenyl liquid crystalline epoxy resin at about 150° C. and about 250° C. Unlike at about 150° C., no pattern of polarized image was observed at about 250° C. This is because the liquid crystalline epoxy resin does not form an aligned molecular structure at high temperatures such as about 250° C.

[Example 1-5] Preparation of Cured Liquid Crystalline Resin Using Linear Polymerization Initiator For the preparation of resins and composites, 4,4'-diglycidyloxybiphenyl, which is in a solid state, and benzyl imidazolium hexafluoroantimonate (BIHA), which is a cationic linear curing agent of 0.5 wt % (Example 1), 1 wt % (Example 2), 2 wt % (Example 3), 3 wt % (Example 4), and 5 wt % (Example 5), respectively, with respect to resins was ground and mixed using mortar or physical milling and mixed with a thinky mixer to increase the degree of mixing. The mixture was then placed in a metal mold and heated at 170° C. for 1 hour while applying a pressure of 10 MPa using a thermocompressor to produce a plate-shaped cured product having a thickness of 3 mm and a diameter of 2 cm.

[Comparative Example 1] Preparation of Cured Liquid Crystalline Resin Using Non-Linear Curing Agent In order to compare the thermal conductivities of resins and composites cured with non-linear curing agents, 4,4'-diglycidyloxybiphenyl was prepared in the same manner as in Examples 1 to 5 except that 4,4'-diaminodiphenylsulfone (37.5 wt %) was used.

Figure 2:
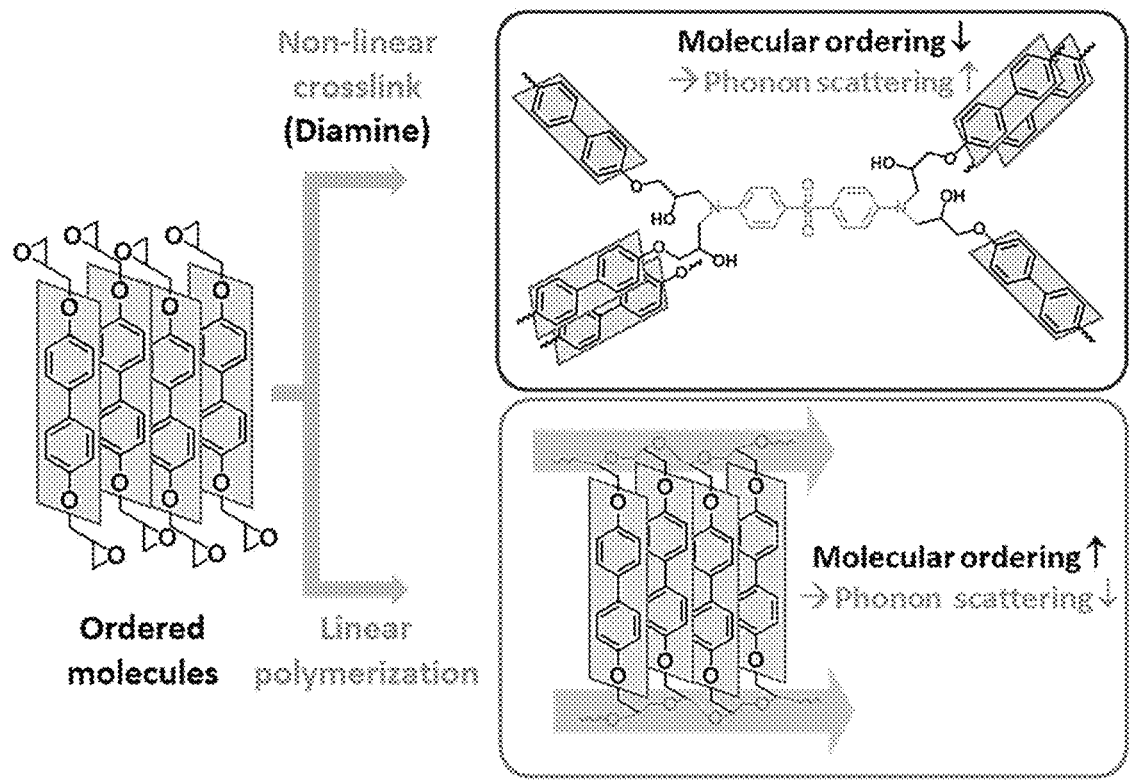
FIG. 2 is a schematic diagram showing a change in molecular structure according to curing by nonlinear polymerization and by linear polymerization of an aligned molecular structure in a high thermal conductive polymer composite according to an embodiment of the present disclosure.

FIG. 2 shows the morphological changes of the aligned molecular structure of the final cured products when curing 4,4'-diglycidyloxybiphenyl (see FIG. 1), aligned due to liquid crystal property, using a 4,4'-DDS which is a non-linear curing agent and curing the same using a linear curing agent.

[Experimental Example 3] Thermal Conductivity Analysis of Cured Liquid Crystalline Resin The thermal conductivity of the cured liquid crystalline resin according to Examples 1 to 5 and Comparative Example 1 was measured. The measurement was carried out using Hot Disk 2500S equipment (ISO 22007-2: 2008) and the measured values were averaged for at least three samples.

TABLE 1

Measured values of thermal conductivity according to curing conditions of high thermal conductive resin

| | Liquid crystalline resin | Polymerization form/Curing agent | Thermal conductivity (W/mK) |
| --- | --- | --- | --- |
| Example 1 | 4,4'-diglycidyloxybiphenyl | linear/0.5 wt % | 0.41 |
| Example 2 | 4,4'-diglycidyloxybiphenyl | linear/1 wt % | 0.43 |
| Example 3 | 4,4'-diglycidyloxybiphenyl | linear/2 wt % | 0.47 |
| Example 4 | 4,4'-diglycidyloxybiphenyl | linear/3 wt % | 0.48 |
| Example 5 | 4,4'-diglycidyloxybiphenyl | linear/5 wt % | 0.45 |
| Comparative Example 1 | 4,4'-diglycidyloxybiphenyl | Non-linear/37.5 wt % | 0.34 |

Herein, 'linear' represents benzyl imidazolium hexafluoroantimonate (BIHA), and 'non-linear' represents 4,4'-diaminodiphenylsulfone (4,4'-DDS), respectively.

According to Table 1 above, there is no significant correlation between the amount of the curing agent and the thermal conductivity in the case of linear polymerization. However, in the case of the linear polymerization, when 0.5 wt % of a polymer was used, there shows a characteristic that it was not sufficiently cured and cracked easily. In addition, when comparing the thermal conductivities of samples cured linear and non-linear polymerization, the sample cured by linear polymerization showed about 40% higher thermal conductivity. This is because, as shown in FIG. 2, in the case of non-linear polymerization such as epoxy-amine, the regular structure formed by liquid crystal is widened by bonding structure, whereas in the case of linear polymerization, the curing is performed while the regular structure is maintained as it is.

[Example 6-11] Preparation of High Thermal Conductive Polymer Composite Using Linear Polymerization Initiator A high thermal conductive polymer composite was prepared in the same manner as in Example 4, except that 10 to 60 vol % of hexagonal boron nitride particles in a plate shape (average diameter 30 um, average thickness 1 um) was further mixed.

[Comparative Example 2-7] Preparation of High Thermal Conductive Polymer Composite Using Non-Linear Polymerization Initiator A high thermal conductive polymer composite was prepared in the same manner as in Comparative Example 1, except that the plate-shaped hexagonal boron nitride particle (average diameter of 30 um, average thickness of 1 um) fillers were further mixed at 10 to 60 vol %, respectively, and the curing temperature was 170° C.

[Experimental Example 4] Analysis of Aligned Molecular Structure of Liquid Crystalline Epoxy Resin and Linear Curing Agent Mixture with Temperature Variation Powder mixture of solid state powder of 4,4'-diglycidyloxybiphenyl liquid crystalline epoxy resin and 3 wt % of benzyl imidazolium hexafluoroantimonate (BIHA), which is a linear polymerization initiator, was placed between two glass slides, and was heated at a rate of 50° C. per minute through a heat stage equipped to a polarizing microscope to observe polarizing microscope images. The results are illustrated in FIGS. 3C and 3D.

Figure 3C:
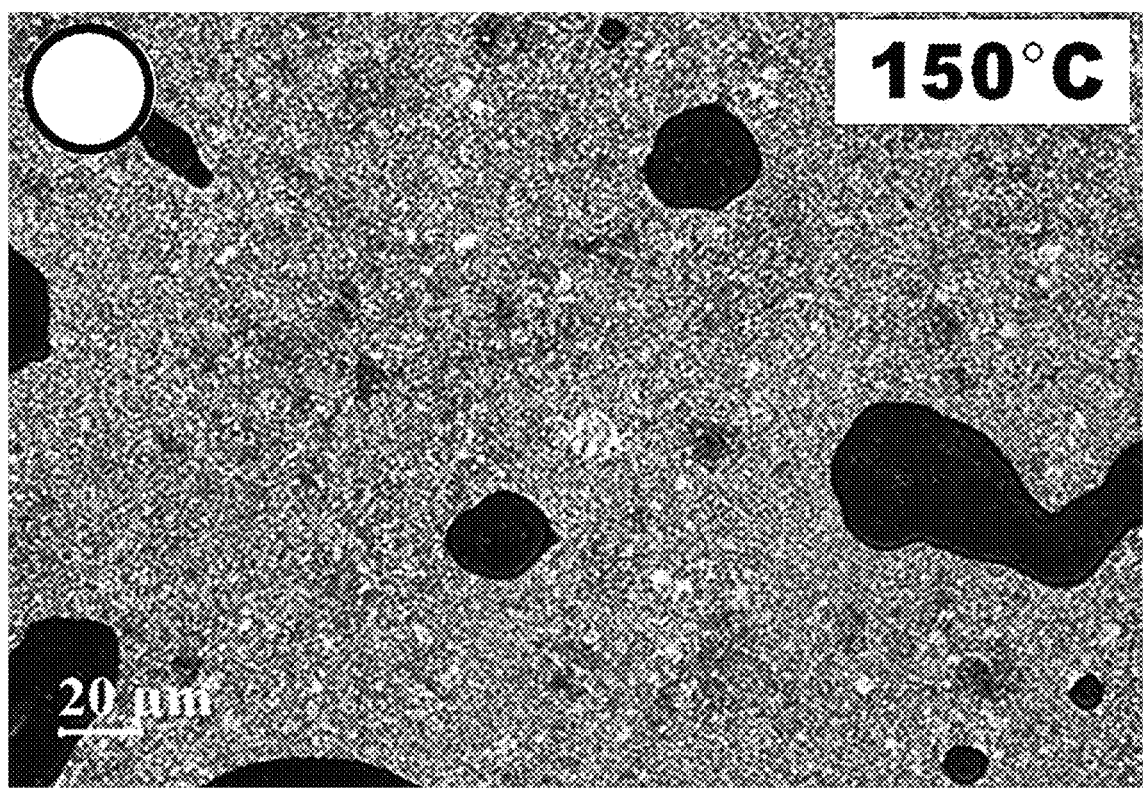
FIG. 3C is a polarizing micrograph of a liquid crystalline epoxy resin according to an embodiment of the present disclosure, in which a cationic linear curing agent is added and heated at 150° C.
Figure 3D:
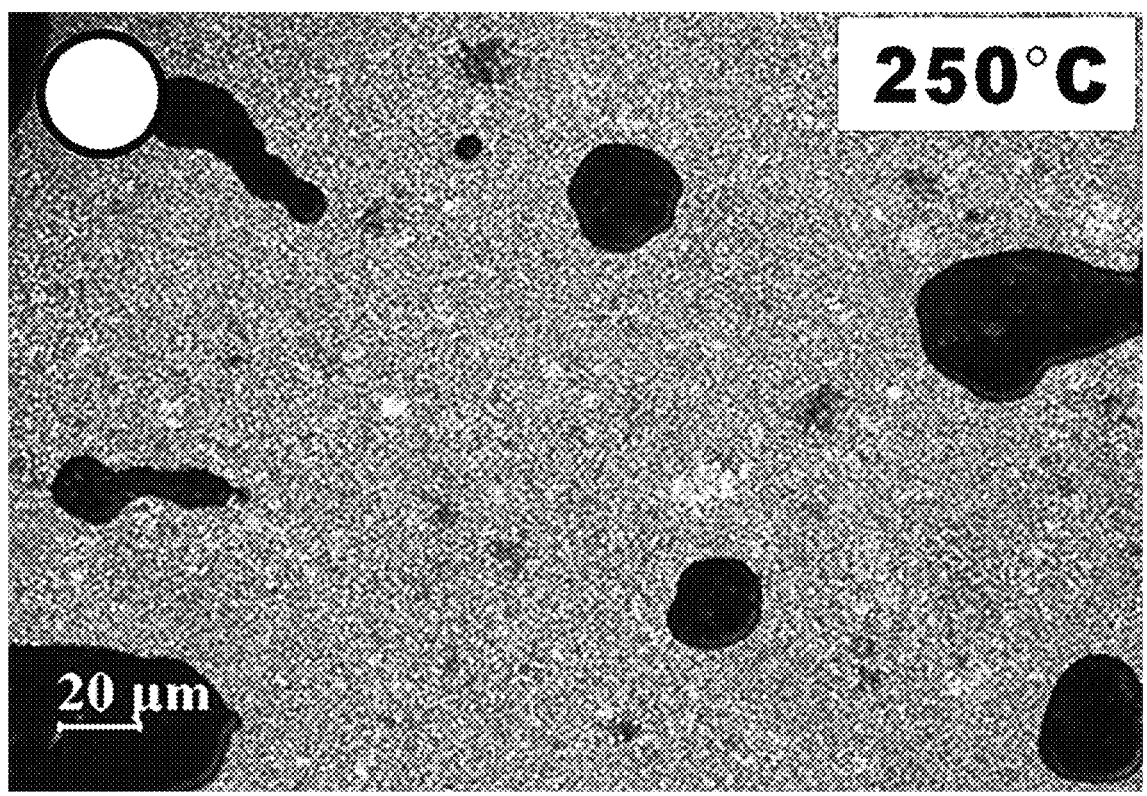
FIG. 3D is a polarizing micrograph of a liquid crystalline epoxy resin according to an embodiment of the present disclosure, in which a cationic linear curing agent is added and heated to 250° C.

FIGS. 3C and 3D show polarizing micrographs of 4,4'-diglycidyloxybiphenyl liquid crystalline epoxy resin at 150° C. and 250° C. Unlike Experimental Example 2, it was found that polarization patterns were maintained at 250° C. This is because the aligned structure at the molecular level was cured rapidly while the structure being maintained by the linear curing agent.

[Experimental Example 5] Crystallinity Analysis of High Thermal Conductivity Resin by Curing Method In order to further specifically confirm that the crystallinity is maintained in the samples cured using the linear polymerizer as described in Experimental Example 4, the crystallinity of 4,4'-diglycidyloxybiphenyl liquid crystalline epoxy resin cured by the methods of linear (benzyl imidazolium hexafluoroantimonate (BIHA) curing) and non-linear (4,4'-diaminodiphenylsulfone 4,4'-DDS) curing) was analyzed using an X-ray diffraction analysis method.

Figure 4:
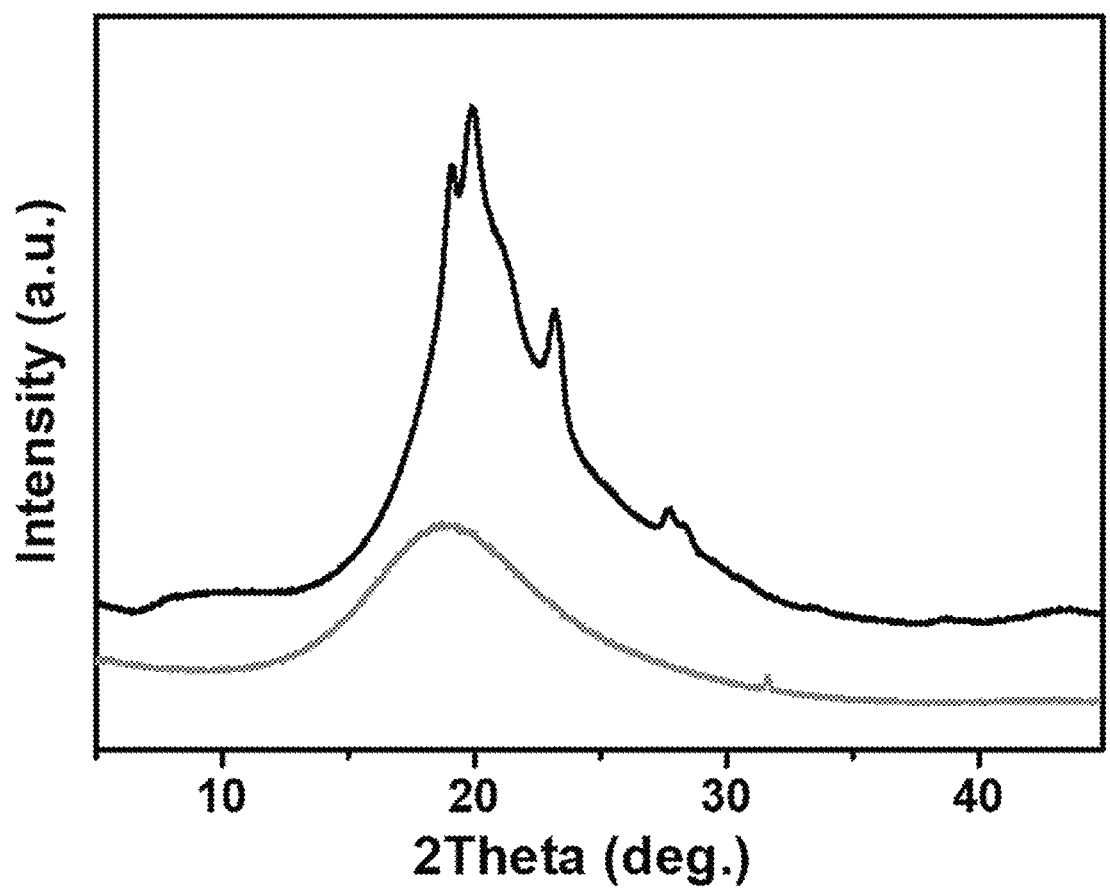
FIG. 4 is a graph showing an X-ray diffraction pattern taken after curing a liquid crystalline epoxy resin according to an embodiment of the present disclosure with nonlinear polymerization (lower end) and linear polymerization (upper end).

FIG. 4 is a graph showing an X-ray diffraction analysis pattern of the two samples, wherein the graph at the top is a linear polymerization, and the graph at the bottom is a nonlinear polymerization. In FIG. 4, the samples cured by non-linear polymerization exhibit a wide range of amorphous characteristic peaks at about 10-35 degrees in 2 theta values, whereas the samples cured by the linear polymerization at the top show a narrow range of peaks due to the regular molecular structure at about 20, 23.5, and 28 degrees. These peaks mean that there is a regular spacing of about 3.1 to 4.6 Angstroms which are in good conformity with the liquid crystal spacing of 4,4'-diglycidyloxybiphenyl liquid crystalline epoxy resin. Accordingly, it can be understood that in the case of linear polymerization, the liquid crystal phase is well maintained and cured.

[Experimental Example 6] Porosity Analysis of Composites Using High Thermal Conductivity Resin and Filler As the method of preparing a composite of Example 1-5, 4,4'-diglycidyloxybiphenyl, which is a liquid crystalline epoxy resin, 3 wt %, relative to the resin, of benzyl imidazolium hexafluoroantimonate, which is a linear polymerization initiator, and hexagonal boron nitride particles in a plate shape were respectively added in an amount of 10 vol % (Example 6), 20 vol % (Example 7), 30 vol % (Example 8), 40 vol % (Example 9), 50 vol % (Example 10), and 60 vol % (Example 11) to prepare the composite.

Figure 5:
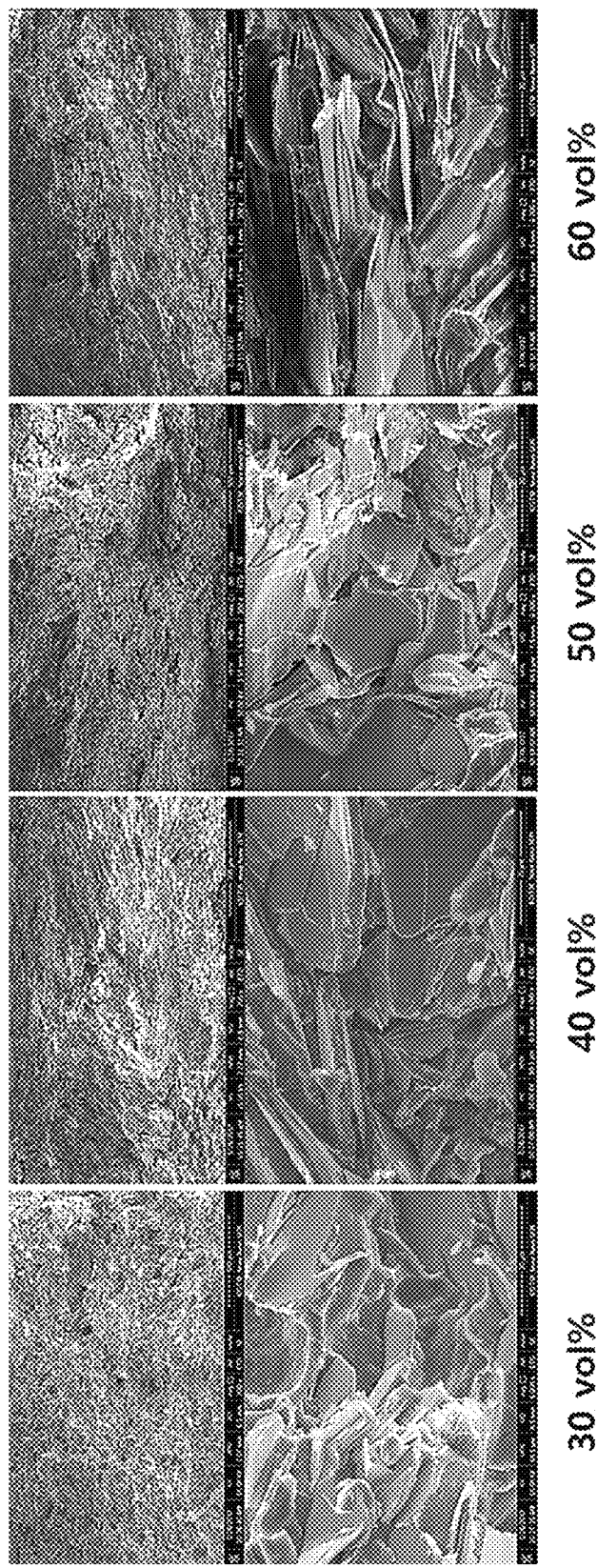
FIG. 5 is an electron microscope cross-sectional photograph of a composite obtained by mixing a liquid crystalline epoxy resin, a plate-shaped hexagonal boron nitride filler as a high thermal conductive filler, and a linear polymerization curing agent according to an embodiment of the present disclosure at different filler ratios and curing.

FIG. 5 is a cross-sectional electron micrograph of the 30-60 vol % composite prepared after curing. It was confirmed that the hexagonal boron nitride particles in a plate shape are arranged in an irregular direction and the resin is well impregnated between the particles. It is very important to confirm the occurrence of pores in the preparation of a composite, and Table 2 shows the porosity according to the volume ratio of the filler. The measured values of the samples were measured by the Archimedes principle, and the theoretical values were calculated by using the density and the concentration of the materials used for the sample preparation.

TABLE 2

The porosity analysis values of liquid crystalline epoxy resins and the hexagonal boron nitride particle composite cured by the linear polymerization initiators

| | Filler contents (vol %) | Density (g/cm$^3$) Measured values | Density (g/cm$^3$) Theoretical values | Porosity (%) |
|---|---|---|---|---|
| Example 4 | 0 | 1.21 | 1.22 | 0 |
| Example 6 | 10 | 1.32 | 1.32 | 0.2 |
| Example 7 | 20 | 1.43 | 1.43 | 0.5 |
| Example 8 | 30 | 1.53 | 1.54 | 0.8 |
| Example 9 | 40 | 1.62 | 1.65 | 1.9 |
| Example 10 | 50 | 1.71 | 1.75 | 2.4 |
| Example 11 | 60 | 1.78 | 1.88 | 4.8 |

According to Table 2, it can be understood that the composite prepared by thermocompression is as low as 5% or less at the maximum of 60 vol %. Accordingly, as a process for preparing a composite using 4,4'-diglycidyloxybiphenyl liquid crystalline epoxy resin, benzyl imidazolium hexafluoroantimonate, which is a linear polymerization initiator, and hexagonal boron nitride particles in a plate shape, a preparation method using grinding, mixing and thermocompression is a very suitable method.

[Experimental Example 7] Measurement of Thermal Conductivity of Liquid Crystalline Epoxy Resin Composites Cured by Linear Polymerization Initiators According to Examples 6 to 11, the thermal conductivity of composite samples prepared by 10-60 vol % using 4,4'-diglycidyloxybiphenyl liquid crystalline epoxy resin, benzyl imidazolium hexafluoroantimonate, which is a linear polymerization initiator, and hexagonal boron nitride particles in a plate shape was measured by the measurement method of Experimental Example 3. The results are summarized in Table 3.

TABLE 3

Thermal conductivity of composites cured by linear polymerization

| | Filler volume ratio (vol %) | Thermal conductivity (W/mK) |
|---|---|---|
| Example 4 | 0 | 0.48 ± 0.3 |
| Example 6 | 10 | 1.7 ± 0.1 |
| Example 7 | 20 | 3.8 ± 0.1 |
| Example 8 | 30 | 6.6 ± 0.2 |
| Example 9 | 40 | 10.9 ± 0.3 |
| Example 10 | 50 | 17.2 ± 0.1 |
| Example 11 | 60 | 23.2 ± 0.5 |

[Experimental Example 8] Measurement of Thermal Conductivity of Liquid Crystalline Epoxy Resin Composites Cured by Non-Linear Polymerization In order to compare the thermal conductivity of the composite cured by the non-linear polymerization with the result of Experimental Example 7, 4,4'-diglycidyloxybiphenyl was mixed with 4,4'-diaminodiphenylsulfone (37.5 wt %) using the manufacturing method of Comparative Example 1, 10-60 vol % plate-like hexagonal boron nitride particles were used for preparation, and the thermal conductivity values are summarized in Table 4.

TABLE 4

Thermal conductivity of composites cured by non-linear polymerization

| | Filler volume ratio (vol %) | Thermal conductivity (W/mK) |
|---|---|---|
| Comparative Example 1 | 0 | 0.34 ± 0.2 |
| Comparative Example 2 | 10 | 1.4 ± 0.3 |
| Comparative Example 3 | 20 | 3.0 ± 0.2 |
| Comparative Example 4 | 30 | 5.0 ± 0.1 |
| Comparative Example 5 | 40 | 8.6 ± 0.2 |
| Comparative Example 6 | 50 | 13.2 ± 0.1 |
| Comparative Example 7 | 60 | 17.5 ± 0.3 |

According to Tables 3 and 4, it was confirmed that the samples cured by the linear polymerization in the filler content of at all the volume ratio have a thermal conductivity improved by 30% or more as compared with the sample by nonlinear amine curing.

The high thermal conductive polymer composites according to the exemplary embodiments of the present disclosure provide enhanced thermal conductivity, and may provide an aligned lattice structure to the final resin and the cured composite as curing is performed while maintaining the microstructure of the resin aligned microscopically. Therefore, phonon scattering is minimized and the composite thereby provides enhanced thermal conductivity as compared to the same resin and composite cured without an aligned lattice structure.

The high thermal conductive polymer composite according to the exemplary embodiments of the present disclosure can maintain the aligned structure of the liquid crystalline resin, and it is possible to improve the transferability of phonon, which is a key factor of heat transfer, and thereby to provide an enhanced thermal conductivity The high thermal conductive polymer composite according to the exemplary embodiments of the present disclosure provides enhanced thermal conductivity even in the same resin and the same filler content, so that the use of expensive fillers can be reduced, and the manufacturing cost of high heat dissipation materials can be lowered.

The embodiments of the present disclosure described above should not be construed as limiting the technical idea of the present disclosure. The scope of protection of the present disclosure is limited only by the matters described in the claims, and those having ordinary skill in the technical field of the present disclosure will be able to improve and modify the technical idea of the present disclosure in various forms. Accordingly, such improvements and modifications will fall within the scope of protection of the present disclosure as long as it is obvious to those skilled in the art.

What is claimed is:

1. A thermally conductive polymer composite, comprising:
a liquid crystalline resin comprising 4,4'-diglycidyloxybiphenyl epoxy resin, and
plate-shaped, hexagonal boron nitride impregnated within the liquid crystalline resin,
which is cured with a linear polymerization initiator present from 0.5 weight percent to 5 weight percent, wherein the boron nitride is present in an amount of 30% to 40% by volume, and the thermal conductivity is in a range of 6.6 W/m-K 10.9 W/m-K, or
the boron nitride is present in an amount of 40% to 50% by volume, and the thermal conductivity is in a range of 10.9 W/m-K to 17.2 W/m-K.

2. A method of preparing a thermally conductive polymer composite of claim 1, the method comprising
mixing the liquid crystalline resin comprising 4,4'-diglycidyloxybiphenyl epoxy resin, the plate-shaped, hexagonal boron nitride, and the 0.5 weight percent to 5 weight percent of a linear polymerization initiator based on the total weight of the mixture to prepare a mixture, wherein the boron nitride is present in the mixture in an amount of 30 to 60% by volume based on the total volume of the mixture, and
thermally curing the mixture by thermocompression at a pressure of 5 MPa or higher and a temperature in the range of 150 to 250° C.

3. The method according to claim 2, wherein the preparation of the mixture comprises the liquid crystalline resin with a molecular aligned structure in at least one direction to form a liquid crystal phase.

4. The method according to claim 3, wherein the molecular alignment structure of the liquid crystal phase is maintained following the thermal curing of the mixture.

5. The method according to claim 3, wherein during the curing, the reactive group of the liquid crystalline resin is linearly polymerized and cured, maintaining the molecular alignment structure of the liquid crystal phase.

6. The method according to claim 2, wherein the linear polymerization initiator is a cationic linear polymerization initiator.

7. The thermally conductive polymer composite according to claim 1, wherein the plate-shaped boron nitride is ordered in an irregular direction with the resin impregnated between the plates.

8. The thermally conductive polymer composite according to claim 1 having a porosity of 3% or less.

9. The thermally conductive polymer composite according to claim 1, wherein the linear polymerization initiator is a cationic linear polymerization initiator.

10. The thermally conductive polymer composite according to claim 1, wherein the linear polymerization initiator is benzyl imidazolium hexafluoroantimonate.

11. The method according to claim 6, wherein the linear polymerization initiator is benzyl imidazolium hexafluoroantimonate.

* * * * *